United States Patent
Martel

(10) Patent No.: US 11,211,863 B2
(45) Date of Patent: Dec. 28, 2021

(54) ARRANGEMENT AND METHOD FOR CURRENT MEASUREMENT

(71) Applicant: Siemens Aktiengesellschaft, Munich (DE)

(72) Inventor: Jean-Mary Martel, Tegernheim (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 71 days.

(21) Appl. No.: 16/701,664

(22) Filed: Dec. 3, 2019

(65) Prior Publication Data
US 2020/0186029 A1    Jun. 11, 2020

(30) Foreign Application Priority Data
Dec. 7, 2018 (DE) .......................... 102018221240.6

(51) Int. Cl.
*H02M 3/155* (2006.01)
*G01R 19/165* (2006.01)
*H03K 5/24* (2006.01)
*G01R 21/06* (2006.01)

(52) U.S. Cl.
CPC .......... *H02M 3/155* (2013.01); *G01R 19/165* (2013.01); *G01R 21/06* (2013.01); *H03K 5/24* (2013.01)

(58) Field of Classification Search
CPC ......... H02M 3/155; H02M 2001/0009; H02M 7/06; G01R 21/06; G01R 19/165; G01R 19/16523; G01R 19/16519; G01R 15/183; H03K 5/24

USPC ...................... 324/522, 76.11, 111, 119, 127
See application file for complete search history.

(56) References Cited

U.S. PATENT DOCUMENTS

| 3,590,362 | A | * | 6/1971 | Kakalec | .............. | H02M 7/5383 363/22 |
| 2010/0264906 | A1 | | 10/2010 | Shamir et al. | | |
| 2011/0291488 | A1 | | 12/2011 | Paik et al. | | |
| 2016/0049856 | A1 | * | 2/2016 | Zhang | .................. | G01R 15/202 363/77 |
| 2016/0258984 | A1 | | 9/2016 | Meehleder | | |

(Continued)

FOREIGN PATENT DOCUMENTS

DE    112010001638 B4    6/2017
GB    2562560 A    11/2018

*Primary Examiner* — Tung X Nguyen
*Assistant Examiner* — Robert P Alejnikov, Jr.
(74) *Attorney, Agent, or Firm* — Harness, Dickey & Pierce, P.L.C.

(57) ABSTRACT

An arrangement includes a conductor, forming the primary side of a transformer, the secondary side being connected to a rectifier circuit. The rectifier output is connected to a voltage stabilizing circuit for an electronic unit and to a first series circuit formed by a first switching component and a first resistor. In the event of a first voltage value being reached at the first input of the voltage stabilizing circuit, the first switching component is switched to be conductive. The secondary current of the transformer flows via the first resistor to drop an electrical voltage across the first resistor. The electric current of conductor is determinable from the voltage. The use of just one transformer used both for energy generation and for current measurement makes it possible to realize a very compact and small design of a current measuring device having a simple construction.

28 Claims, 5 Drawing Sheets

(56) References Cited

U.S. PATENT DOCUMENTS

| | | | |
|---|---|---|---|
| 2017/0149340 A1* | 5/2017 | Ye | H02M 3/33507 |
| 2020/0177985 A1* | 6/2020 | Tews | H04R 1/1066 |
| 2020/0186021 A1* | 6/2020 | Wang | H02M 1/08 |
| 2020/0408810 A1* | 12/2020 | Martel | G01R 19/0023 |

* cited by examiner

ARRANGEMENT AND METHOD FOR CURRENT MEASUREMENT

PRIORITY STATEMENT

The present application hereby claims priority under 35 U.S.C. § 119 to German patent application number DE 102018221240.6 filed Dec. 7, 2018, the entire contents of which are hereby incorporated herein by reference.

FIELD

Embodiments of the invention generally relate to an arrangement and a method for determining the level of the electric current of a conductor of a low-voltage circuit.

BACKGROUND

Low voltage is taken to mean voltages of up to 1000 volts for AC voltage or up to 1500 volts for DC voltage. Low voltage is taken to mean, in particular, voltages that are greater than an extra-low voltage, having values of 50 volts AC voltage or 120 volts DC voltage.

Low-voltage circuits or networks or installations are taken to mean electric circuits having rated currents of up to 6300 amperes, more specifically up to 1200 amperes, 630 amperes, 125 amperes or 63 amperes.

Such low-voltage circuits are protected by various monitoring and protective devices, such as miniature circuit breakers, circuit breakers in the form of molded case circuit breakers or air circuit breakers, residual current breakers, arc fault detection devices, power and current monitoring devices, etc.

For all these devices it is generally necessary to determine the level of the electric current.

Current sensors are increasingly being demanded which are intended to determine the level of the electric current at specific points in the low-voltage circuit or network.

The realization of an (intelligent) current sensor that is able to measure a current accurately and to transmit the data if possible without an external power supply is very difficult.

The most important technical requirements made of such a sensor are:

High nominal current: the sensor is intended to effect accurate measurement up to the nominal current and under overload conditions.

Low start-up current: the sensor is intended to operate and effect measurement even at very low current (in the range of 1% of the nominal current or a few amperes).

The measurement is intended to be accurate, for example to satisfy accuracy class 1.

The intention is to integrate a solution for a power supply.

The sensor is intended to be small and reasonably priced.

Known current sensors generally have the following disadvantages:

using an internal energy store, such as a battery, for energy supply, including disadvantage of limited life and operating temperature;

energy generation with primary current flow using a converted current and using a separate transformer for measuring the current, including the disadvantage of becoming costly and large;

energy generation via sunlight or some other light source, including the disadvantage of not being suitable for indoor applications.

SUMMARY

Embodiments of the present invention specify an arrangement and a method for determining a level of an electric current for a low-voltage circuit; in particular an arrangement able to be realized in a compact and simple manner and in particular via a small design.

At least one embodiment of the invention is directed to an arrangement for determining a level of the electric current for a low-voltage circuit, comprising:

a conductor of the low-voltage circuit, forming the primary side of a transformer, the secondary side of the transformer being connected to a rectifier circuit, the first output of the rectifier circuit being connected firstly via a first diode to a voltage stabilizing circuit for an electronic unit having a controller and secondly to a first series circuit formed by a first switching component and a first resistor, wherein the arrangement is configured such that, in the event of a first voltage value being reached at the first input of the voltage stabilizing circuit, the first input is connected to the first diode, the first switching component is switched to be conductive, such that the secondary current of the transformer flows via the first resistor, as a result of which an electrical voltage is dropped across the first resistor, the electric current of conductor is determinable from the voltage, and that in the event of a second voltage value being undershot (subsequently) at the first input of the voltage stabilizing circuit, the first input is connected to the first diode, and the first switching component is switched to be current-blocking, such that the secondary current of the transformer flows via the first diode and the voltage stabilizing circuit.

At least one embodiment of the invention furthermore is directed to a parallel method for determining the level of the electric current of a conductor of a low-voltage circuit, wherein:

the current of the conductor is transformed into a secondary current, and the secondary current is used alternately either for generating a DC supply voltage for an electronic unit or for determining the level of the electric current of the conductor.

At least one embodiment of the invention furthermore is directed to an arrangement for determining a level of an electric current for a low-voltage circuit, comprising:

a conductor of the low-voltage circuit, forming a primary side of a transformer, a secondary side of the transformer being connected to a rectifier circuit, a first output of the rectifier circuit being connected firstly, via a first diode, to a voltage stabilizing circuit for an electronic unit including a controller and being connected secondly to a first series circuit formed by a first switching component and a first resistor, wherein the arrangement is configured such that, in an event of a first voltage value being reached at the first input of the voltage stabilizing circuit, the first input being connected to the first diode, the first switching component is switched to be conductive, such that the secondary current of the transformer flows via the first resistor, resulting in an electrical voltage being dropped across the first resistor, the electric current of conductor being determinable from the electrical voltage, and wherein the arrangement is configured such that, in an event of a second voltage value being undershot at the first input of the voltage stabilizing circuit, the first input being connected to the first diode, the first switching component is switched to be current-blocking, such that the secondary current of the transformer flows via the first diode and the voltage stabilizing circuit.

At least one embodiment of the invention furthermore is directed to a method for determining a level of electric current of a conductor of a low-voltage circuit, the method comprising:

transforming the electric current of the conductor is into a secondary current; and using the secondary current alternately either for generating a DC supply voltage for an electronic unit or for determining the level of the electric current of the conductor.

BRIEF DESCRIPTION OF THE DRAWINGS

The described properties, features and advantages of this invention and the way in which they are achieved will become clearer and more clearly understood in association with the following description of the example embodiments which are explained in greater detail in association with the drawings.

In this case, in the drawings.

DETAILED DESCRIPTION OF THE EXAMPLE EMBODIMENTS

Figure 1:
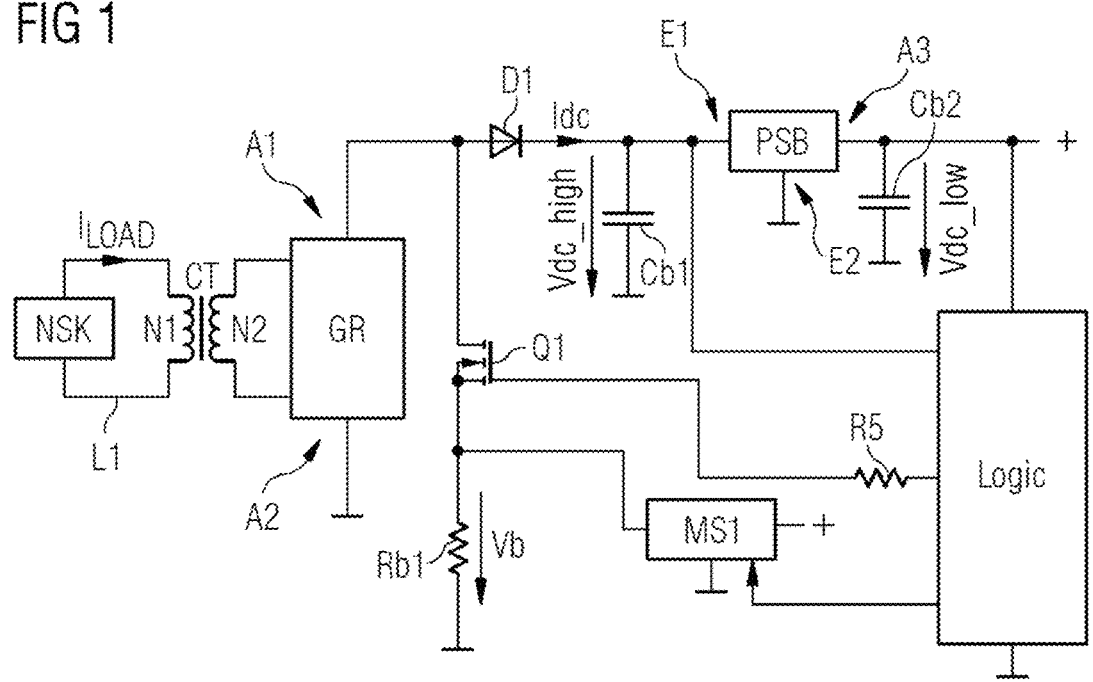
FIG. 1 shows a first illustration of an arrangement for elucidating an embodiment of the invention.

In the following, embodiments of the invention are described in detail with reference to the accompanying drawings. It is to be understood that the following description of the embodiments is given only for the purpose of illustration and is not to be taken in a limiting sense. It should be noted that the drawings are to be regarded as being schematic representations only, and elements in the drawings are not necessarily to scale with each other. Rather, the representation of the various elements is chosen such that their function and general purpose become apparent to a person skilled in the art.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

Various example embodiments will now be described more fully with reference to the accompanying drawings in which only some example embodiments are shown. Specific structural and functional details disclosed herein are merely representative for purposes of describing example embodiments. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated. The present invention, however, may be embodied in many alternate forms and should not be construed as limited to only the example embodiments set forth herein.

It will be understood that, although the terms first, second, etc. may be used herein to describe various elements, components, regions, layers, and/or sections, these elements, components, regions, layers, and/or sections, should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items. The phrase "at least one of" has the same meaning as "and/or".

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. In contrast, when an element is referred to as being "directly" connected, engaged, interfaced, or coupled to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising,"

"includes," and/or "including," when used herein, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Before discussing example embodiments in more detail, it is noted that some example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order. Although the flowcharts describe the operations as sequential processes, many of the operations may be performed in parallel, concurrently or simultaneously. In addition, the order of operations may be re-arranged. The processes may be terminated when their operations are completed, but may also have additional steps not included in the figure. The processes may correspond to methods, functions, procedures, subroutines, subprograms, etc.

Specific structural and functional details disclosed herein are merely representative for purposes of describing example embodiments of the present invention. This invention may, however, be embodied in many alternate forms and should not be construed as limited to only the embodiments set forth herein.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

At least one embodiment of the invention provides an arrangement for determining a level of the electric current for a low-voltage circuit, comprising:

a conductor of the low-voltage circuit, which forms the primary side of a transformer, the secondary side of which is connected to a rectifier circuit, the first output of which is connected firstly via a first diode to a voltage stabilizing circuit for an electronic unit having a controller and secondly to a first series circuit formed by a first switching component and a first resistor, wherein the arrangement is configured in such a way that in the event of a first voltage value being reached at the first input of the voltage stabilizing circuit, the first input being connected to the first diode, the first switching component is switched to be conductive, such that the secondary current of the transformer flows via the first resistor, as a result of which an electrical voltage is dropped across the first resistor, the electric current of conductor being determinable from the voltage, and that in the event of a second voltage value being undershot (subsequently) at the first input of the voltage stabilizing circuit, the first input being connected to the first diode, the first switching component is switched to be current-blocking, such that the secondary current of the transformer flows via the first diode and the voltage stabilizing circuit.

The use of just one transformer used both for energy generation and for current measurement makes it possible to realize a very compact and small design of a current measuring device having a simple construction. At least one embodiment of the invention involves switching back and forth alternately between energy supply and measurement when corresponding limit values are exceeded or undershot and reached, respectively.

Advantageous configurations of the invention are specified in the claims.

In one advantageous configuration of at least one embodiment of the invention, the controller is connected to:

the first input of the voltage stabilizing circuit, the first input being connected to the first diode, in order to determine an event of voltage values being reached or undershot, the first switching component in order to cause the latter to be switched to be conductive or current-blocking depending on the voltage values being reached or undershot.

This has the particular advantage that a particularly simple realization is made possible.

In one advantageous configuration of at least one embodiment of the invention, the connection between the controller and the first input of the voltage stabilizing circuit, the first input being connected to the first diode, comprises a voltage divider, in particular having a third and a fourth resistor.

This has the particular advantage that the voltage is reduced to a value that is suitable e.g. for processing via a microprocessor.

In one advantageous configuration of at least one embodiment of the invention, the connection between first switching component and controller comprises a fifth resistor.

This has the particular advantage of affording current limiting for the switching component.

In one advantageous configuration of at least one embodiment of the invention, a first capacitor is connected between the first input of the voltage stabilizing circuit, the first input being connected to the first diode, and the second input of the voltage stabilizing circuit.

This has the particular advantage of affording, besides the energy storage in the voltage stabilizing circuit (by way of the capacitance thereof), further energy storage via a capacitor (having a high capacitance, e.g. greater than 100 µF, 150 µF, 200 µF, 300 µF, 400 µF, 500 µF, 600 µF, 700 µF, 800 µF, 900 µF, 1 mF, 2 mF, 3 mF, 4 mF, 5 mF), which can store a large amount of energy and thus enables a long measurement cycle.

In one advantageous configuration of at least one embodiment of the invention, a second capacitor is connected to the output of the voltage stabilizing circuit.

This has the particular advantage that the output voltage for the electronic unit or controller/further units is once again buffered or smoothed.

In one advantageous configuration of at least one embodiment of the invention, a voltage limiting component, in particular one or two diodes, in particular Zener diode or suppressor diode, or a varistor, is connected between the two terminals of the secondary side of the transformer.

This has the particular advantage of affording protection of the energy supply or measurement against excessively high voltages or voltage spikes in particular situations, particularly in the event of high primary currents.

In one advantageous configuration of at least one embodiment of the invention, the rectifier circuit comprises a bridge rectifier.

This has the particular advantage of affording a particularly simple realization for the rectification.

In one advantageous configuration of at least one embodiment of the invention, the transformer (CT) comprises a core composed of soft-magnetic material.

This has the particular advantage that a good transformation ratio is achieved, in particular a sufficiently high secondary current or voltage is generated for low primary currents.

In one advantageous configuration of at least one embodiment of the invention, the transformer comprises a core comprising a material having a relative permeability of greater than 3000, more specifically greater than 5000, 7000 or 10 000 ($\mu r > 3000$, . . . ).

This has the particular advantage that a good transformation ratio is achieved, in particular a sufficiently high secondary current or voltage is generated for low primary currents.

In one advantageous configuration of at least one embodiment of the invention, the primary side of the transformer has a turns number of one.

This has the particular advantage that only one conductor has to be led through a core, as a result of which particularly simple retrofitting of the invention into existing installations is made possible since only a (splittable) core with the secondary winding need be placed around the conductor.

In one advantageous configuration of at least one embodiment of the invention, the first or/and second switching component is/are a field effect transistor, in particular a normally off type or enhancement-mode type.

This has the particular advantage of affording a particularly simple realization, in particular of affording an approximately power-free switch, having a residual current of approximately zero and an approximately maximum conductivity.

In one advantageous configuration of at least one embodiment of the invention, the first resistor is connected to a first measuring circuit, which, in the conductive phases of the first switching component determines the level of the electric current of the conductor from the secondary current of the transformer flowing via the first resistor.

This has the particular advantage that a value for the level of the electric current is directly present.

In one advantageous configuration of at least one embodiment of the invention, the first measuring circuit is connected to a transmitter or transceiver, via which the level of the electric current is able to be communicated.

This has the particular advantage that communication with self-sufficiency of energy is implemented directly besides the detection.

In one advantageous configuration of at least one embodiment of the invention, the controller is connected to the first measuring circuit, which obtains a signal in the event of voltage values being reached or undershot.

This has the particular advantage that the measuring circuit is synchronized in parallel with the switching component, such that a measurement is effected in the conducting phases of the switching component.

In one advantageous configuration of at least one embodiment of the invention, the controller is connected to the transmitter or transceiver. In the event of a third voltage value being reached at the first input of the voltage stabilizing circuit, the input being connected to the first diode, the transmitter or transceiver is activated for emitting a signal of the level of the current. In this case, the third voltage value is higher than the first voltage value.

This has the particular advantage that the transmitter or transceiver is activated only given the presence of an increased amount of energy determined by the level of the voltage. As a result, the overall energy amounts can be improved or the measurement time outage can be reduced.

In one advantageous configuration of at least one embodiment of the invention, the transmitter or transceiver (Trcv), the controller (Logic) and the first measuring circuit (MS1) are part of the electronic unit (EB).

This has the particular advantage that a particularly compact construction is achieved.

In one advantageous configuration of at least one embodiment of the invention, a second series circuit formed by a second switching component and a second resistor is provided in parallel with the first series circuit.

This has the particular advantage that by virtue of the resistors having resistance values that differ in their level, it is possible to determine more accurately the level of the current in different current ranges.

In one advantageous configuration of at least one embodiment of the invention, the first resistor (Rb1) has a higher resistance value than the second resistor (Rb2), such that a higher voltage is dropped across the first resistor (Rb1) for the same secondary current, as a result of which smaller currents are determinable.

This has the particular advantage of enabling both small and large currents to be determined accurately.

In one advantageous configuration of at least one embodiment of the invention, in the event of the first voltage value being reached, the first switching component is switched to be conductive and the level of the electric current of the conductor is determined via the first measuring circuit, and in the event of a first current value of the level of the current of the first conductor being exceeded:

the first switching component is switched to be current-blocking, the second switching component is switched to be conductive, and the level of the current is determined via the second measuring circuit.

This has the particular advantage of beginning with a measurement of small currents and, in the event of large currents being present, immediately switching over to determining the level thereof.

In one advantageous configuration of at least one embodiment of the invention, the first measuring circuit comprises a signal conditioning circuit, a filter, an analog-to-digital converter or/and a microprocessor.

This has the particular advantage of enabling the level of the electric current to be determined particularly accurately.

At least one embodiment of the invention furthermore is directed to a parallel method for determining the level of the electric current of a conductor of a low-voltage circuit, wherein:

the current of the conductor is transformed into a secondary current, and the secondary current is used alternately either for generating a DC supply voltage for an electronic unit or for determining the level of the electric current of the conductor.

In one advantageous configuration of at least one embodiment of the invention, for generating a DC supply voltage, a first capacitor is charged and, in the event of a first voltage value being reached at the capacitor, the secondary current flows via a first resistor, as a result of which an electrical voltage is dropped across the first resistor, the electric current of the conductor being determined from the voltage; in the event of a second voltage value being undershot at the first capacitor, the secondary current via the first resistor is blocked and is used for generating the supply voltage.

This has the particular advantage of affording a particularly simple method for energy supply and current measurement using only one transformation/transformer.

All configurations, both in dependent form referring back to the independent patent claims and referring back only to individual features or feature combinations of patent claims, bring about an improvement of an arrangement for current measurement.

FIG. 1 shows an illustration of an arrangement according to an embodiment of the invention comprising a low-voltage circuit NSK comprising a conductor L1 having a current $I_{Load}$, the level of which is intended to be determined. The conductor L1 forms the primary side N1 of a transformer CT, preferably having a core, the secondary side N2 of which, usually having a plurality of turns, is connected to a rectifier circuit GR. The rectifier circuit can contain a bridge or Graetz rectifier circuit. The second output A2 of the rectifier circuit GR is connected to a common potential or ground potential, as depicted. By way of example, the second output A2 can be at the negative potential of the rectified secondary voltage.

The first output A1, which is at the positive potential in this example, is firstly connected to the first terminal of a first diode D1 connected in the forward direction; in the example, the anode of the first diode is connected to the first output A1.

The first diode D1 is connected at its other end, by its second terminal (cathode in the example), to a first capacitor Cb1, which is connected at its other end to the common potential or ground potential. The second terminal of the first diode D1 is furthermore connected to the first input E1 of a voltage stabilizing circuit PSB for generating a supply voltage. For example for an electronic unit EB having a controller Logic or only for the controller Logic (the electronic unit EB contains e.g. only the controller Logic). For this purpose, the output A3 of the voltage stabilizing circuit PSB is connected to the electronic unit EB/controller Logic.

The second input E2 of the voltage stabilizing circuit PSB is connected to the common potential/ground potential and at the same time forms the output of the voltage stabilizing circuit PSB.

A second capacitor Cb2 for further stabilization or/and smoothing of the output voltage can be provided at the output A3 of the voltage stabilizing circuit PSB. This capacitor is in turn connected to the common potential/ground potential. A second voltage $V_{dc\_low}$ is present across the second capacitor Cb2 or at the output of the voltage stabilizing circuit PSB. The second voltage can have a value of 5 volts, 3.3 volts or 1.8 volts, for example.

In the example in accordance with FIG. 1, a first measuring circuit MS1 is furthermore connected to the output A3 of the voltage stabilizing circuit PSB, this being identified by two plus symbols. The first measuring circuit MS1 is thereby supplied with energy.

The first output A1 of the rectifier circuit is secondly connected to a series circuit formed by a first switching component Q1 and a first resistor Rb1. The series circuit is connected at its other end to the common potential/ground potential.

The first switching component Q1 can be a transistor, field effect transistor, semiconductor switch or the like. In particular, a field effect transistor of the enhancement mode or enhancement-mode type/normally off type is advantageous.

If the first switching component Q1 is switched to be conducting, a current flows through the first resistor Rb1. A voltage Vb is thus dropped across the first resistor, the voltage being dependent on the level of the resistance and, of course, of the current.

In the example in accordance with FIG. 1, the first measuring circuit MS1 is connected to the first resistor Rb1 at the junction point between first switching component Q1 and first resistor Rb1. The second connection to the measuring circuit is produced by the common potential/ground potential.

The controller Logic is firstly connected to the first input E1 of the voltage stabilizing circuit PSB, the second terminal of the first diode D1 and the first capacitor Cb1 being connected to the first input. Downstream of the first diode D1, a current $I_{dc}$ flows to the first capacitor Cb1 and to the voltage stabilizing circuit PSB, respectively. A first voltage $V_{dc\_high}$ is present across the first capacitor Cb1.

In the controller Logic, the first voltage $V_{dc\_high}$ is monitored in respect of reaching or exceeding a first voltage value $V_{DC\_high\_max}$. Furthermore in respect of subsequently undershooting a second voltage value $V_{DC\_high\_min}$. By way of example, the controller Logic comprises at least one comparator for this purpose.

The controller Logic is secondly connected to the first switching component Q1, for example to the gate terminal of a field effect transistor, for example via a fifth resistor R5.

A controller Logic can furthermore be connected to the first measuring circuit MS1, for example by the signal for the first switching component Q1 being transmitted to the first measuring circuit MS1 in parallel, with a slight time delay or in a shortened fashion, for the purpose of synchronizing the measuring process with the switching process.

The first measuring circuit MS1 determines the level of the electric current of the conductor L1 from the level of the voltage drop Vb across the first resistor Rb1. This value can be made available by the measuring circuit MS1, for example be transmitted to further applications or units, such as miniature circuit breakers, circuit breakers, (current) monitoring devices, etc.

Figure 2:
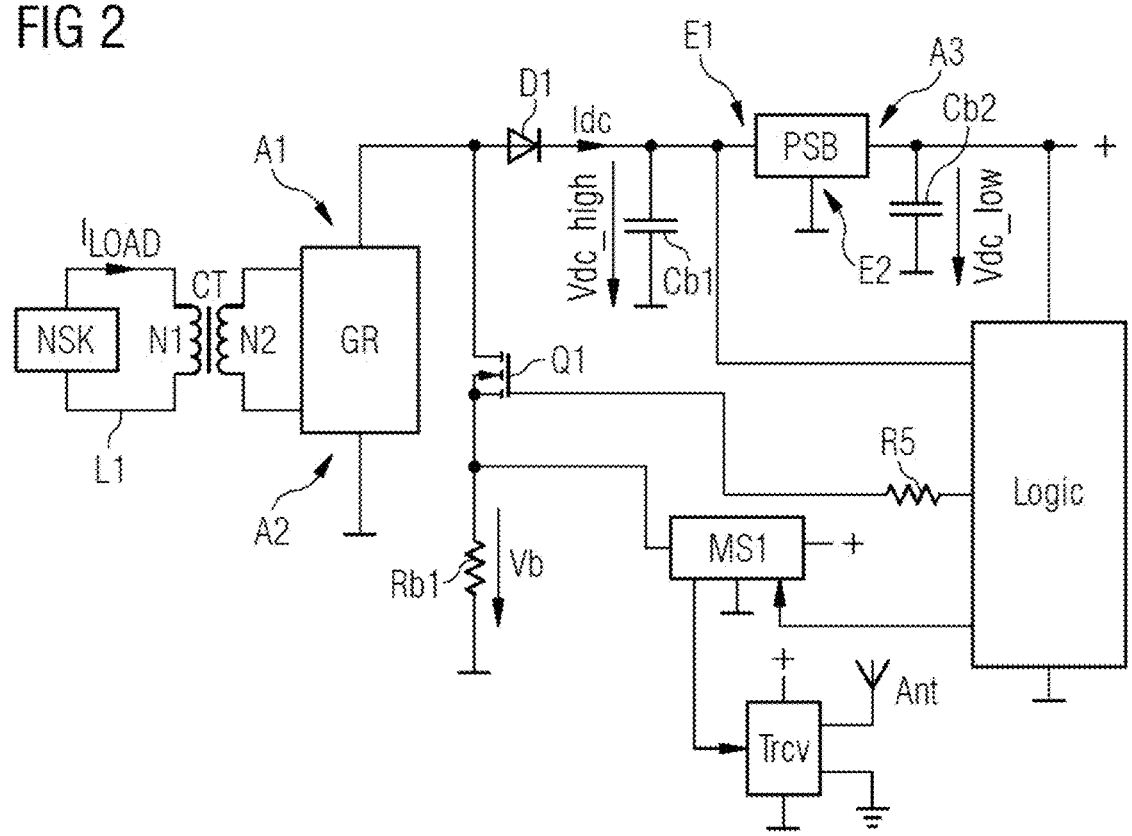
FIG. 2 shows a second illustration of an arrangement for elucidating an embodiment of the invention.

FIG. 2 shows an arrangement in accordance with FIG. 1, with the difference that a transmitter or transceiver $T_{rcv}$ is connected to the first measuring circuit MS1. The transmitter or transceiver can communicate the determined level of the current. For example to a further unit or control center.

The transmitter/transceiver Trcv can be supplied with energy by the voltage stabilizing circuit PSB, this being indicated by a further plus symbol. The transmitter or transceiver $T_{rcv}$ comprises an antenna Ant.

Figure 3:
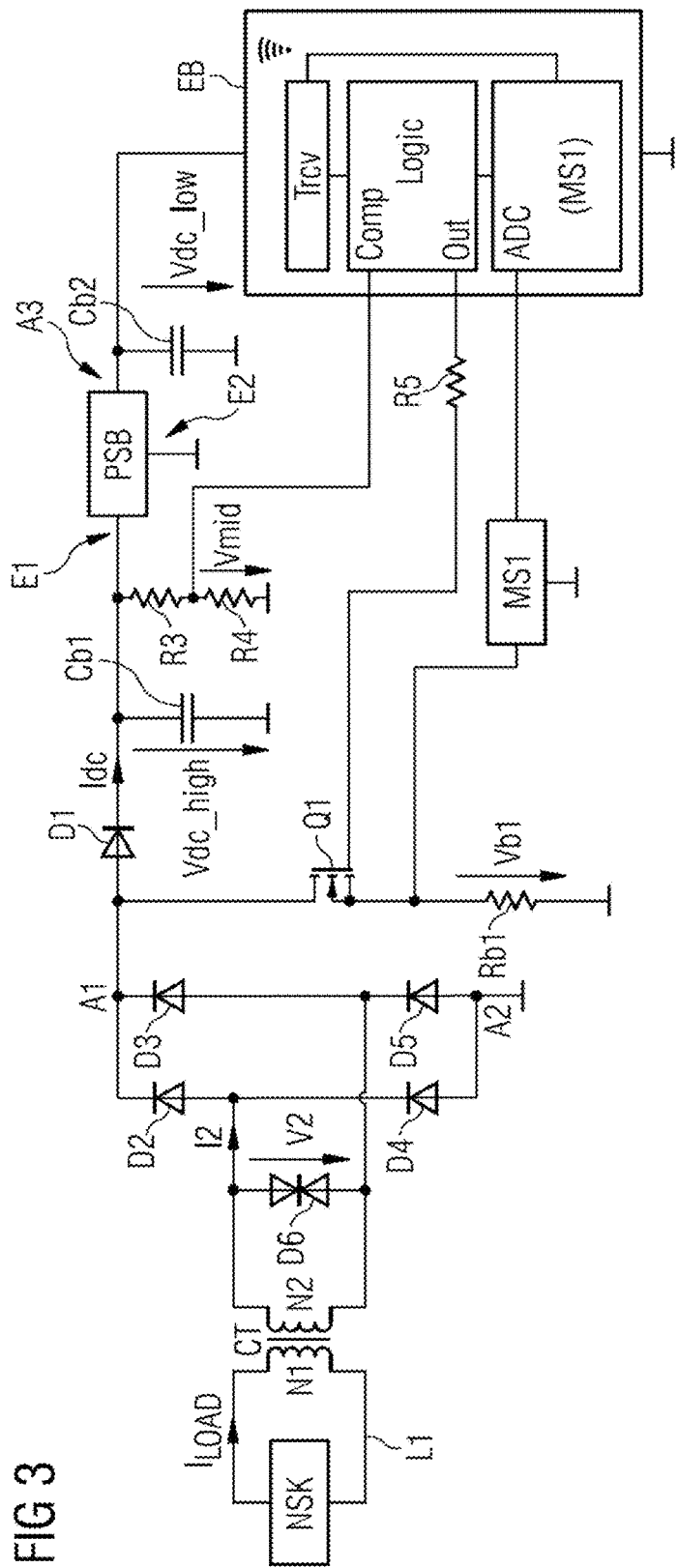
FIG. 3 shows a third illustration of an arrangement for elucidating an embodiment of the invention.

FIG. 3 shows an arrangement in accordance with FIG. 2, with the difference that the rectifier circuit GR is realized as a bridge rectifier circuit having a second, third, fourth and fifth diode D2, D3, D4, D5. On the secondary side, a secondary current I2 with a secondary voltage V2 is fed to this circuit.

Furthermore, a voltage limiting component D6 is connected in parallel with the secondary winding N2 of the transformer CT, i.e. between the two terminals of the secondary side. This can be e.g. a suppressor diode, a varistor or the antiparallel connection of one or a plurality of (series-connected) diodes.

Furthermore, the connection between the controller Logic and the first input E1 of the voltage stabilizing circuit PSB, the first input being connected to the first diode D1, comprises a voltage divider. In the example constituted by a third and fourth resistor R3, R4. As a result, the first voltage $V_{dc\_high}$ is fed after having been reduced as divider voltage $V_{mid}$ to the controller Logic, for example to a comparator Comp of the controller Logic.

Furthermore, the controller Logic is part of the electronic unit EB, which furthermore comprises the transceiver $T_{rcv}$ and a part ADC of the first measuring circuit MS1.

In the example in accordance with FIG. 3, the first measuring circuit MS1 is divided, for example by a part of the measuring circuit, for example an analog-to-digital converter ADC, being part of the electronic unit EB. That part of the measuring circuit MS1 which does not belong to the electronic block can contain for example a signal conditioning facility, amplifiers or/and filters.

The controller Logic can be connected to the first switching component Q1 via an output Out.

Figure 4:
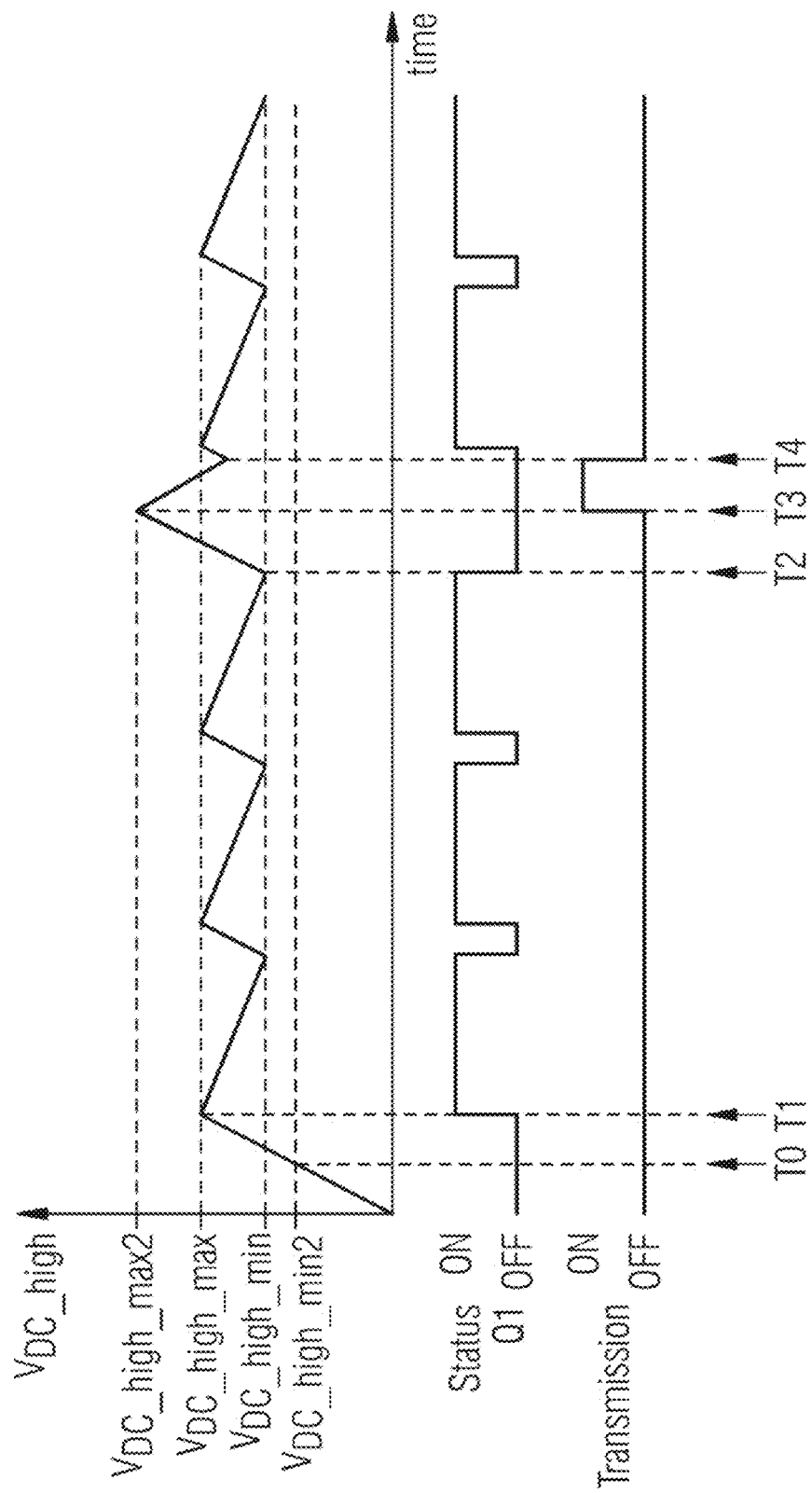
FIG. 4 shows an illustration of a time profile for elucidating an embodiment of the invention.

FIG. 4 shows in the upper part a profile of the first voltage $V_{dc\_high}$ or $V_{DC\_high}$ (identical) against time.

The level of the voltage $V_{DC\_high}$ has various voltage values. A first voltage value $V_{DC\_high\_max}$, a second voltage value $V_{DC\_high\_min}$, a third voltage value $V_{DC\_high\_max}^2$ and a fourth voltage value $V_{DC\_high\_min}^2$.

The middle part illustrates an associated switching state Status of the first switching component Q1. If the first switching component Q1 is switched to be conductive or conducting, this is represented by the switching state or level ON, and if the first switching component Q1 is switched to be current-blocking or nonconducting, this is represented by the switching state or level OFF.

The lower part illustrates an associated Transmission state of the transmitter or transceiver $T_{rcv}$, wherein a transmission is represented by the level ON and a lack of transmission or reception is represented by the level OFF.

Furthermore, a zeroth, first, second, third and fourth point in time T0, T1, T2, T3 and T4 are depicted.

The zeroth point in time T0 identifies the end of the sleep cycle of the arrangement; the fourth voltage value $V_{DC\_high\_min}^2$ is reached. Starting from this point in time, there is enough energy present to provide a voltage for the controller Logic/electronic unit EB, such that these can operate.

The first point in time (T1) identifies the end of the charging process of the first capacitor Cb1, such that enough energy is present for a measuring process to take place.

The second point in time (T2) identifies the reaching of a predefined or necessary number of data or data points from which a current value, intended to be transmitted for example, is determinable.

The third point in time (T3) identifies an end of an overcharging process of the arrangement.

The fourth point in time (T4) identifies the end of a transmission process of the transmitter or transceiver $T_{rcv}$.

Figure 5:
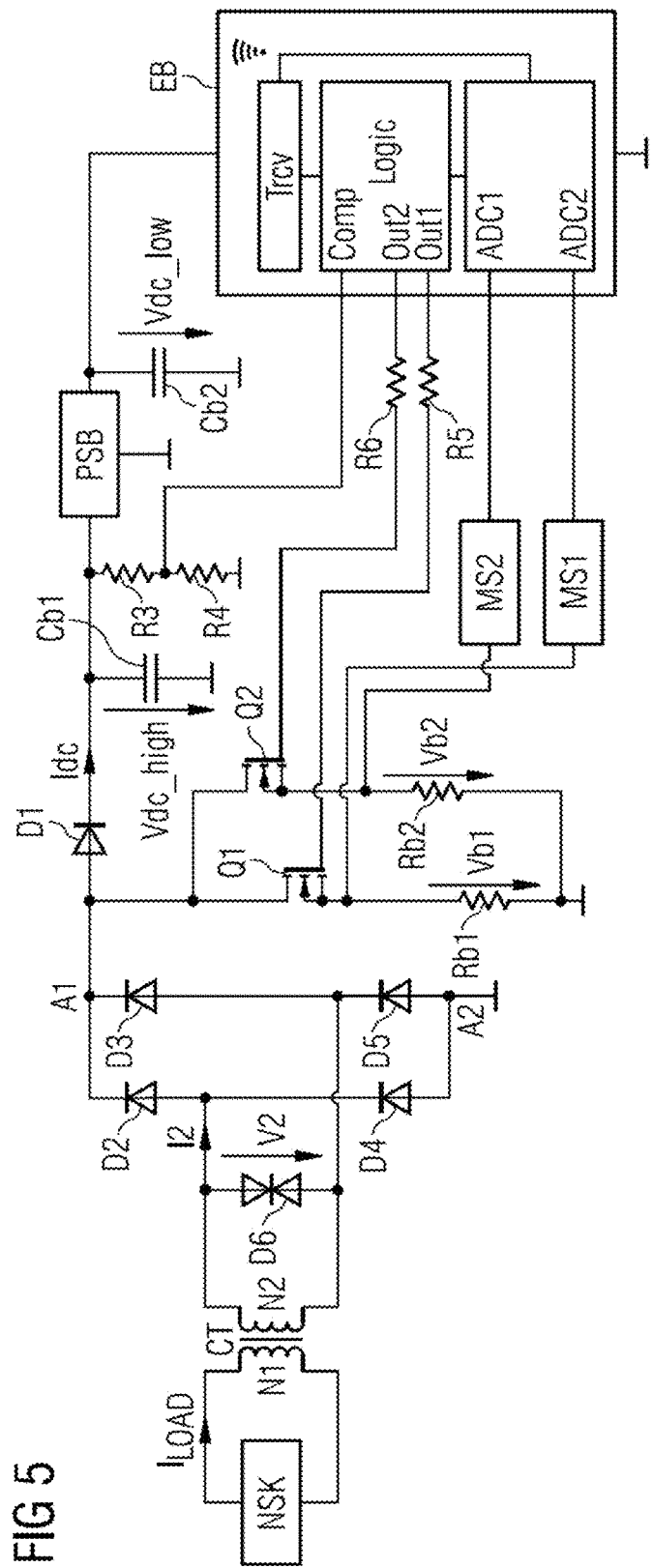
FIG. 5 shows a fourth illustration of an arrangement for elucidating an embodiment of the invention.

FIG. 5 shows an arrangement in accordance with FIG. 3, with the difference that provision is made of a second series circuit formed by a second switching component Q2 and a second resistor Rb2, the second series circuit being arranged in parallel with the first series circuit.

Furthermore, provision is made of a second measuring circuit MS2 for the second series circuit.

The second measuring circuit MS2 can be connected to a second analog-to-digital converter ADC2, which is part of the electronic unit EB.

The second switching component Q2 is connected to the controller Logic via a second output OUT2. A sixth resistor R6 can be provided in this connection.

The second series circuit and associated circuitry is constructed analogously to the first series circuit, the level of the resistance values of the first and second resistors Rb1, Rb2 preferably being different.

An embodiment of the invention will be explained in greater detail in a different way below.

The transformer (CT or current transformer) contains a soft-magnetic core; a primary side/primary winding N1 in which the load current ILoad flows; and a secondary side/secondary winding N2 in which the transformed current flows. The number of turns N2 (the reference sign N2 is also used as the turns number) of the secondary side/secondary winding and the relative permeability of the soft-magnetic core are high enough ($\mu r > 3000$, 5000, 7000, 10 000) to obtain a sufficient secondary voltage, given a very low primary current.

A suppressor diode D6 or some other protective component is used to protect the arrangement or circuit against overvoltages on account of an overcurrent flowing through the transformer CT.

A rectifier circuit GR, e.g. constituted by the diodes D2 to D5, rectifies the secondary voltage V2 in order to obtain a DC voltage for measurement and energy or respectively power supply.

A first diode D1 is used to avoid a current from the first capacitor Cb1 and/or the voltage stabilizing circuit PSB back to the first series circuit and/or second series circuit, particularly if the first/second switching component Q1/Q2 is switched to be conducting.

When the arrangement is not in operation (at the start or when the primary current is too low), the first switching component Q1 is switched to be current-blocking (nonconducting), i.e. off.

The secondary-side current I2 from the transformer CT flows through the first diode D1 and charges the first capacitor Cb1. The first voltage $V_{dc\_high}/V_{DC\_high}$ at the first capacitor Cb1 rises; this is illustrated in FIG. 4 by the rise in the first voltage $V_{DC\_high}$ until the point in time T1.

The voltage stabilizing circuit PSB begins to make a second voltage $V_{dc\_low}$ available at its output A3, for example by way of conversion and stabilization. This begins from the point in time T0 when the fourth voltage value $V_{DC\_high\_min2}$ is reached at the input of the voltage stabilizing circuit PSB. This ensures that enough energy is available for waking up the electronic unit EB.

A voltage divider formed by the third and fourth resistors R3, R4 or some other suitable voltage converter reduces the first voltage $V_{dc\_high}$ to a level that is compatible with a comparator input Comp of the controller Logic. The comparator can also be a separate comparator circuit that outputs a low or a high value depending on the value of the first voltage $V_{dc\_high}$. The controller Logic has an output OUT or OUT1, OUT2 for controlling the state of the switching component Q1, Q2.

As soon as the first voltage $V_{dc\_high}$ is equal to or greater than the first voltage value $V_{DC\_high\_max}$, the first switching component Q1 is activated, i.e. switched on, in order to become conducting/conductive. During this time the current I2 from the secondary winding N2 flows through the first resistor Rb1 (load resistor). In this case, no current flows via the first diode D1 to the first capacitor and/or voltage stabilizing circuit PSB since the (input) voltage level there is sufficiently high.

A (measurement) voltage Vb is thus dropped across the first resistor Rb1. The voltage is detected or tapped off by the first measuring circuit MS1. Via the measuring circuit, the voltage can be conditioned, amplified or/and filtered, furthermore subjected to analog-to-digital conversion, and also processed further.

During this measurement, the energy, i.e. the first voltage, at the first capacitor Cb1 decreases. The measurement is carried out as long as the first voltage $V_{DC\_high}$ is above the second voltage value $V_{dc\_high\_min}$. If this condition is no longer met, i.e. the second voltage value has been/is undershot, the first switching component Q1 is switched to be current-blocking/nonconducting. The measuring process can be ended here. The secondary current I2 can again flow to the first capacitor Cb1 and once again charge the latter.

The second voltage value $V_{DC\_high\_min}$ must ensure the proper function of the voltage stabilizing circuit PSB. It must furthermore be above the fourth voltage value $V_{DC\_high\_min2}$, the minimum voltage.

The first voltage value should preferably be:

$$V_{DC\_high\_max} \geq \sqrt{V_{DC\_high\_min}^2 + \frac{2 \cdot V_{DC} \cdot I_M \cdot t_M}{C_{B\_high} \cdot \eta}} \qquad 1$$

wherein $I_M$ is the current consumed by the electronic unit (controller/measuring circuit) during the measurement, $t_M$ is the expected duration of the measurement phase, $\eta$ is the efficiency of the voltage stabilizing circuit PSB, $C_{B\_high}$ is the capacitance of the first capacitor Cb1, $V_{DC}$ is the level of the second voltage $V_{dc\_low}$.

The relationship between the switching state Status of the first switching component Q1 and the first voltage $V_{dc\_high}$ is illustrated in FIG. 4.

This arrangement according to an embodiment of the invention results in a continuous change from the energy supply phase to the measurement phase or between energy supply phase and measurement phase. The duration of the measurement phase depends principally on the capacitance of the first capacitor Cb1 and the current consumption of the circuit (electronic unit EB, controller Logic or/and first/second measuring circuit MS1, MS2). These parameters are not completely accurately controllable and can vary with time, temperature or other situations. The supply time (charging time of the first capacitor Cb1) additionally varies with the actual value of the transformed current. For this reason, the continuous change between supply and measurement phases is generally aperiodic and not predictable.

The accurate determination or calculation of the level of the current, e.g. of the root-mean-square value of the current, during the measurement phase requires e.g. a sufficient number of data, which are preferably digitized in a complete period T with the frequency F of the current.

This can be e.g. as follows. The following formula is used for calculating the root-mean-square value of the current I1 of the conductor L1:

$$I_1 = \frac{1}{S_e} \cdot \sqrt{\frac{1}{N_d} \cdot \sum_{i=1}^{N_d} V_{b,i}^2}$$

wherein Se is the sensitivity of the transformer in V/A. This sensitivity can be calibrated. It can have this value:

$$S_e \approx \frac{N_1 \cdot R_b}{N_2}$$

wherein $R_b$ is the resistance value of the first resistor $R_{b1}$, $N_1$ is the turns number of the primary side/primary winding and $N_2$ is the turns number of the secondary side/secondary winding.

If the primary side has a turns number of one ($N_1=1$), this formula is simplified as:

$$S_e \approx \frac{R_b}{N_2}$$

$N_d$ is the number of digitized values of the (measurement) voltage $V_b$ across the first resistor Rb1. For an acceptable accuracy, the detection time or measurement time should be much greater than a period T of the current to be determined in order to detect a plurality of periods of the current to be measured.

Furthermore, the sampling frequency $F_d$ should be much greater than the frequency F of the current to be determined.

A good accuracy can be obtained with:

$$\frac{N_d}{F_d} \gg T \rightarrow \frac{N_d}{F_d} > 20 \cdot T$$

$$F_d \gg F \rightarrow F_d > 50 \cdot F$$

In other words, given a power supply system frequency of F=50 Hz and a resultant period duration of T=20 ms, the measurement time will be 400 ms or greater. The sampling frequency should be 2500 Hz or greater.

Given 2500 samplings per second and a measurement time (detection time) of 400 ms, this results in $N_d$=1000 samples for the measurement time.

The complete number of data $N_d$ can be obtained during one or many measurement phases. Digitizing and calculating the current value generally requires a very low current consumption (e.g. less than 1 mA). However, more energy/current is required for (wireless) communication of the result via a transmitter or transceiver $T_{rcv}$ to an external device, e.g. a data concentrator. Present-day (energy-saving) transceivers, e.g. BLE, Zigbee, RF-Sub-GHz, during a transmission phase of 10 ms, consume approximately 6 mA in order to transmit the result/level of the current and possibly to obtain a confirmation, e.g. from an external device.

This means that the current consumption for some time is much greater than during a measurement phase, with signal detection and calculation, for example.

According to an embodiment of the invention, this is achieved by the first capacitor $C_{b1}$ being supplied with more energy, i.e. being charged more highly, before a transmission process. For this purpose, according to an embodiment of the invention, before a transmission process, the first voltage value $V_{dc\_high\_max}$ is replaced by a third voltage value $V_{dc\_high\_max2}$, or that is to say the voltage value is increased or changed.

The third voltage value must ensure that the voltage $V_{dc\_high}$ remains above the second voltage value $V_{dc\_high\_min}$ during the transmission process (for the transmission) of the current value/result by the transmitter or transceiver $T_{rcv}$.

This is illustrated in FIG. 4 with the points in time T2, T3, T4.

The third voltage value should be in this case for example:

$$V_{DC\_high\_max2} = \sqrt{V_{DC\_high\_min}^2 + \frac{2 \cdot V_{DC} \cdot I_{TR} \cdot t_{TR}}{C_{B\_high} \cdot \eta}} \qquad 2$$

wherein $I_{TR}$ is the current consumed by the electronic unit (controller/transmitter/transceiver) during a transmission phase, $t_{TR}$ is the expected transmission duration/duration of the transmission, $\eta$ is the efficiency of the voltage stabilizing circuit PSB, $C_{B\_high}$ is the capacitance of the first capacitor Cb1, $V_{DC}$ is the level of the second voltage $V_{dc\_low}$.

The contribution of the input power from the secondary winding to the charging of the volume capacitor is not taken into account in this equation since it cannot be ensured that the load current continues to flow during the transmission.

In other words, the first voltage value is cyclically replaced by the third voltage value in order subsequently to carry out a transmission process. After the transmission process, the third voltage value is replaced again by the first voltage value.

Alternatively, after a specific number of samples has been reached, the first voltage value can be replaced by the third voltage value in order subsequently to carry out a transmission process. After the transmission process, the third voltage value is replaced again by the first voltage value.

Both can be effected by the controller Logic, advantageously in association with the first/second measuring circuit MS1, MS2.

In the case of an arrangement having a large difference between nominal current (e.g. 400 A, 250 A) and start-up current for the measurement (e.g. a few amperes), the use of a single first resistor requires a large dynamic range of an analog-to-digital converter in order to achieve a desired accuracy over the entire range, i.e. for minimum and maximum current.

Alternatively, an adjustable gain can be provided. This is complex, however.

According to an embodiment of the invention, a large measurement range with corresponding accuracy can be achieved by the use of a plurality of or many resistors and switching components, as is shown with two series circuits as an example in FIG. 5.

FIG. 5 shows an embodiment comprising two resistors Rb1 and Rb2, which are respectively connected to the switching components Q1, Q2 (switching transistors). Rb1 serves for measuring lower load currents. It has a higher resistance value and results in a higher sensitivity as a result of the higher voltage drop. Rb2 has a lower resistance and is used for measuring higher currents. During operation, the range of the current value is estimated roughly and the suitable resistor is selected. The corresponding switching component is switched on. By way of example, only one switching component can be switched on during a measurement phase. With the use of many resistors for different current ranges, the level of the voltage for the measuring circuit possibly need not be altered and a resolution of the analog-to-digital converter can be employed.

Alternatively, first the resistor for the low current can be used and, in the event of a (respective) current value being exceeded, the next resistor for the next higher current can be switched on (with the previous resistor being switched off) until a determination of the level of the current is made possible.

At least one embodiment of the invention advantageously makes it possible to realize a precise and wireless device having a self-generated power supply for determining the level of the current of a conductor, e.g. as a communication sensor, in particular with the lowest possible starting current for the measurement function. At least one embodiment of the invention is suitable in particular for rated currents of 63 amperes, 125 amperes, 250 amperes and 400 amperes.

Such a device can be used and be beneficial for measuring the current at various points of electrical networks. For example for controlling intelligent networks or for identifying electricity theft. The realization with energy harvesting and wireless communication is very practical since no cabling is required.

By using just one transformer with an electronic unit, for example with a microprocessor, it is possible to realize a very small and compact construction.

Although the invention has been more specifically illustrated and described in detail by way of the example embodiments, nevertheless the invention is not restricted by the examples disclosed and other variations can be derived therefrom by the person skilled in the art, without departing from the scope of protection of the invention.

The patent claims of the application are formulation proposals without prejudice for obtaining more extensive patent protection. The applicant reserves the right to claim even further combinations of features previously disclosed only in the description and/or drawings.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. An arrangement for determining a level of an electric current for a low-voltage circuit, comprising:
   a conductor of the low-voltage circuit, forming a primary side of a transformer, a secondary side of the transformer being connected to a rectifier circuit, a first output of the rectifier circuit being connected firstly, via a first diode, to a voltage stabilizing circuit for an electronic unit including a controller and being connected secondly to a first series circuit formed by a first switching component and a first resistor,
   wherein the arrangement is configured such that, in an event of a first voltage value being reached at the first input of the voltage stabilizing circuit, the first input being connected to the first diode, the first switching component is switched to be conductive, such that the secondary current of the transformer flows via the first resistor, resulting in an electrical voltage being dropped across the first resistor, the electric current of conductor being determinable from the electrical voltage, and
   wherein the arrangement is configured such that, in an event of a second voltage value being undershot at the first input of the voltage stabilizing circuit, the first input being connected to the first diode, the first switching component is switched to be current-blocking, such that the secondary current of the transformer flows via the first diode and the voltage stabilizing circuit.

2. The arrangement of claim 1, wherein the controller is connected to:
   the first input of the voltage stabilizing circuit, the first input of the voltage stabilizing circuit being further connected to the first diode to determine an event of voltage values being reached or undershot, and
   the first switching component, to cause the first switching component to be switched to be conductive or current-blocking depending on the voltage values being reached or undershot.

3. The arrangement of claim 2, wherein the connection between the controller and the first input of the voltage stabilizing circuit, the first input being connected to the first diode, comprises
   a voltage divider, in particular having a third and a fourth resistor.

4. The arrangement of claim 2, wherein the connection between first switching component and controller includes a fifth resistor.

5. The arrangement of claim 3, wherein the voltage divider includes a third and a fourth resistor.

6. The arrangement of claim 5, wherein the connection between first switching component and controller includes a fifth resistor.

7. The arrangement of claim 1, wherein a first capacitor is connected between the first input of the voltage stabilizing circuit, the first input being connected to the first diode, and the second input of the voltage stabilizing circuit.

8. The arrangement of claim 7, wherein a second capacitor is connected to the output of the voltage stabilizing circuit.

9. The arrangement of claim 1, wherein a voltage limiting component is connected between the two terminals of the secondary side of the transformer.

10. The arrangement of claim 9, wherein the voltage limiting component includes one or two diodes including a Zener diode or a suppressor diode, or a varistor.

11. The arrangement of claim 1, wherein the rectifier circuit includes a bridge rectifier.

12. The arrangement of claim 1, wherein the transformer includes a core composed of soft-magnetic material.

13. The arrangement of claim 1, wherein the transformer includes a core comprising a material having a permeability of greater than 3000.

14. The arrangement of claim 1, wherein the primary side of the transformer includes a turns number of one.

15. The arrangement of claim 1, wherein the first switching component is a field effect transistor.

16. The arrangement of claim 1, wherein the first resistor is connected to a first measuring circuit to, in conductive phases of the first switching component, determine the level of the electric current of the conductor from the secondary current of the transformer flowing via the first resistor.

17. The arrangement of claim 16, wherein the first measuring circuit is connected to a transmitter or transceiver, the level of the electric current being able to be communicated via the transmitted or transceiver.

18. The arrangement of claim 17, wherein the controller is connected to the transmitter or transceiver, and wherein, in the event of a third voltage value being reached at the first input of the voltage stabilizing circuit, the input being connected to the first diode, the transmitter or transceiver is activated for emitting a signal of the level of the current.

19. The arrangement of claim 17, wherein the transmitter or transceiver, the controller and the first measuring circuit are part of the electronic unit.

20. The arrangement of claim 17, wherein the controller is connected to the first measuring circuit, the first measuring circuit being configured to obtain a signal in an event of voltage values being reached or undershot.

21. The arrangement of claim 16, wherein the controller is connected to the first measuring circuit, the first measuring circuit being configured to obtain a signal in an event of voltage values being reached or undershot.

22. The arrangement of claim 1, wherein a second series circuit formed by a second switching component and a second resistor is provided in parallel with the first series circuit.

23. The arrangement of claim 22, wherein the second switching component is connected to the controller and the second resistor is connected to a second measuring circuit.

24. The arrangement of claim 22, wherein the first resistor has a relatively higher resistance value than the second resistor, such that a relatively higher voltage is dropped across the first resistor for a same secondary current, resulting in relatively smaller currents are determinable.

25. The arrangement of claim 24, wherein, in an event of the first voltage value being reached, the first switching component is switched to be conductive and the level of the electric current of the conductor is determined via the first measuring circuit, and in event of a first current value of the level of the current of the first conductor being exceeded:
   the first switching component is switched to be current-blocking, the second switching component is switched to be conductive,
   the level of the current is determined via the second measuring circuit.

26. The arrangement of claim 1, wherein the first measuring circuit comprises at least one of a signal conditioning circuit, a filter, an analog-to-digital converter and a microprocessor.

27. The arrangement of claim 1, wherein the controller includes a comparator circuit.

28. A method for determining a level of electric current of a conductor of a low-voltage circuit, the method comprising:
   transforming the electric current of the conductor is into a secondary current; and
   using the secondary current alternately either
      for generating a DC supply voltage for an electronic unit or
      for determining the level of the electric current of the conductor,
   wherein, for generating the DC supply voltage, a first capacitor is charged and, in an event of a first voltage value being reached at the first capacitor, the secondary current flows via a first resistor, resulting in an electrical voltage being dropped across the first resistor, the electric current of the conductor being determined from the voltage, and wherein, in an event of a second voltage value being undershot at the first capacitor, the secondary current is blocked via the first resistor and is used for generating the supply voltage.

* * * * *